United States Patent [19]

Schröder

[11] Patent Number: 4,490,687

[45] Date of Patent: Dec. 25, 1984

[54] ELECTRONIC AMPLIFIER

[75] Inventor: Ernst F. Schröder, Hanover, Fed. Rep. of Germany

[73] Assignee: Licentia Patent-Verwaltungs-G.m.b.H., Frankfurt am Main, Fed. Rep. of Germany

[21] Appl. No.: 450,632

[22] Filed: Dec. 17, 1982

[30] Foreign Application Priority Data

Dec. 19, 1981 [DE] Fed. Rep. of Germany ....... 3150436

[51] Int. Cl.$^3$ .............................................. H03G 3/20
[52] U.S. Cl. .................................... 330/279; 330/281; 330/278
[58] Field of Search ................. 330/86, 131, 141, 278, 330/279, 282, 285; 333/14

[56] References Cited

U.S. PATENT DOCUMENTS 3,848,194 11/1974 Nishimura et al. ................. 330/278
4,390,847 6/1983 Yamada et al. ..................... 330/281

FOREIGN PATENT DOCUMENTS 41310 12/1981 European Pat. Off. .
1915511 10/1980 Fed. Rep. of Germany .
2924373 12/1980 Fed. Rep. of Germany .

OTHER PUBLICATIONS

Funkschau, vol. 53, No. 24, 11/81, pp. 67-69, (Munich).
Wireless World, vol. 84, No. 1511, 7/78, p. 74, (London).
Funkschau, vol. 47, No. 10/213, 1975, pp. 81-82, (Munich).

Primary Examiner—James B. Mullins
Assistant Examiner—G. Wan
Attorney, Agent, or Firm—Spencer & Frank

[57] ABSTRACT

An electronic amplifier composed of an electronically controllable amplifier element having a control input for receiving a voltage the value of which determines the gain of the element, with one such value being a predetermined basic gain value of the amplifier element, a control voltage generating circuit for generating a control voltage whose value determines the voltage at the control input of the amplifier element, the element and circuit being constructed for causing the gain of the amplifier element to be unity for one voltage value at its control input and to be different than unity for other voltage values, a nonlinear filter unit connected between the control voltage generating circuit and the amplifier element control input for supplying to the control input a voltage determined by the control voltage, the filter unit including an integrating branch and a differentiating branch having a rectifier device for causing the differentiating branch to be effective only during periods when the control voltage is varying in a selected direction, and a device for switching the amplifier element and the control voltage generating circuit to a mode of operation in which the amplifier element operates with a constant gain value.

7 Claims, 4 Drawing Figures

ELECTRONIC AMPLIFIER

BACKGROUND OF THE INVENTION

The present invention relates to an electronic amplifier of the type having a predetermined basic gain, or amplification factor, and to a circuit for generating a control voltage for regulating the amplifier gain.

In connection with amplifiers, it is known to change the basic gain in such a manner that a different degree of amplification is provided for input signals having an amplitude that is higher or lower than a predetermined value. This principle is employed, for example, in companders.

In a known type of amplifier, such as one known by the trade name CX, the gain is regulated by a nonlinear filter arrangement including an integrating branch and a differentiating branch, the differentiating branch being intended to be effective through a diode or rectifier circuit only when the control voltage is rising.

SUMMARY OF THE INVENTION

It is an object of the present invention to provide an electronic amplifier which can be operated as a neutral amplifier and as a dynamically controlled amplifier.

The above and other objects are achieved, according to the invention, by the provision of an electronic amplifier composed of an electronically controllable amplifier element having a control input for receiving a voltage the value of which determines the gain of the element, with one such value being a predetermined basic gain value of the amplifier element, a control voltage generating circuit for generating a control voltage whose value determines the voltage at the control input of the amplifier element, the element and circuit being constructed for causing the gain of the amplifier element to be unity for one voltage value at its control input and to be different than unity for other voltage values, a nonlinear filter unit connected between the control voltage generating circuit and the amplifier element control input for supplying to the control input a voltage determined by the control voltage, the filter unit including an integrating branch and a differentiating branch having a rectifier device for causing the differentiating branch to be effective only during periods when the control voltage is varying in a selected direction, and means for switching the amplifier element and the control voltage generating circuit to a mode of operation in which the amplifier element operates with a constant gain value.

For further explanation of the invention, a plurality of embodiments will now be described with reference to the drawings.

DESCRIPTION OF THE PREFERRED EMBODIMENTS

Figure 1:
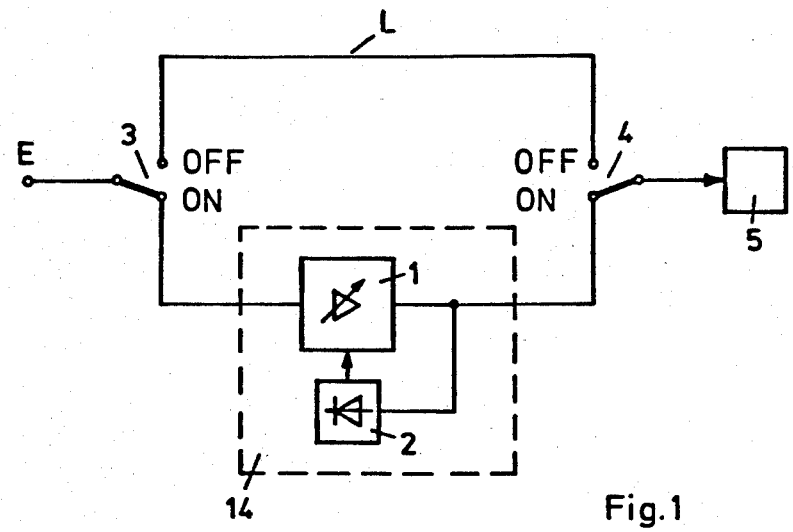
FIG. 1 is a block circuit diagram of an amplifier equipped with a control circuit and connectable shunt path, illustrating certain principles of the invention.

FIG. 1 shows an amplifier 1 whose gain can be varied by means of a control circuit 2. The control circuit 2 generates a direct gain control voltage for the amplifier in dependence on the signal voltage obtained at the input or at the output of amplifier 1. Together with the control characteristic of amplifier 1 and the transmission characteristic of control circuit 2, this results in a defined curve for the signal dependent gain of the entire arrangement 14, as described, for example, in IEEE Proc. Vol. 111, No. 3, March 1964, at page 510. In the amplifier shown here, the signals are obtained at the output of amplifier 1.

The signals to be amplified are fed to amplifier 1 via an input terminal E and a switch 3. The amplifier signals travel through a switch 4 to a load 5, e.g. a further amplifier. The two terminals of switches 3 and 4 not connected to amplifier 1, are connected together via a line L which practically constitutes a bypass for the amplifier 1. The legends ON-OFF at switches 3 and 4 therefore identify the effectiveness of the amplifier 1 with respect to the signals. The costs involved for manufacture of the above-described switching arrangement are relatively high. In particular, the system requires the switching of signal carrying lines which calls for complicated shielding measures if, for example, switches 3 and 4 are spatially separated from circuit 14.

These costs can be reduced by instead placing the control voltage for amplifier 1 at a fixed value. This value may correspond, for example, to the neutral point of the gain characteristic. The neutral point is usually understood to mean that point on the gain characteristic where the output signal corresponds to the input signal. The fixed value, however, need not necessarily correspond to the neutral point.

A deviation of the fixed value from the neutral point would have the result that the gain of the amplifier 1 is fixed by the fixed control voltage to a value of greater or less than one. This may become necessary, for example, during the transmission of electrical signals representing audio signals so as to obtain a loudness impression in the "ON" and "OFF" positions which is identical from a hearing psychology point of view.

The switching point is advantageously placed between the output of control circuit 2 and the control input of amplifier 1. It is of particular advantage if this switching is selectively provided in a control circuit 2 whose direct control voltage is conducted to amplifier 1 via a filter arrangement operating according to the CX principle.

Figure 2:
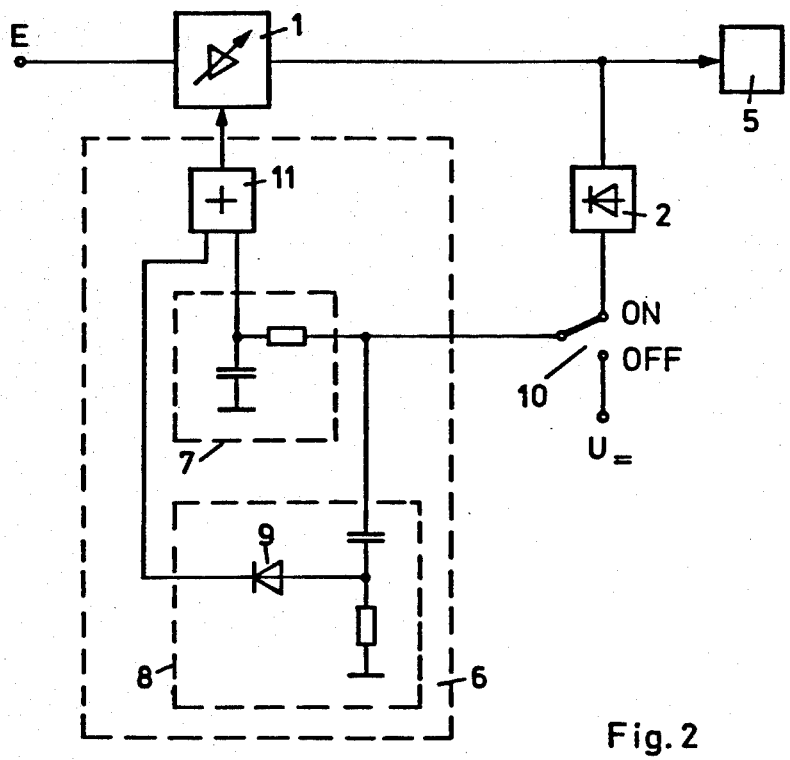
FIG. 2 is a block circuit diagram of an amplifier equipped with a control circuit and a nonlinear filter in the control path, according to a preferred embodiment of the invention.

FIG. 2 shows such a circuit. It is here advisable to place the switching point before, i.e. at the input side of, the nonlinear filter arrangement 6 so as to keep interference in the lines between the control circuit 2 and circuit 10 away from controllable amplifier 1. In FIG. 2, the signals travel from input terminal E directly to amplifier 1 and from the output of amplifier 1 to the input of control circuit 2. The direct control voltage of control circuit 2 is applied via a switch 10 to the input of the filter arrangement 6.

Filter arrangement 6 includes two parallel arranged filters 7 and 8 whose inputs are connected to switch 10 and whose output signals are added in an adder circuit 11. Filter circuit 8 forms a representation of the time differential of the control voltage which has a differentiated effect, with a diode 9 transmitting only the positive components of the control voltage differential, which correspond to rising portions of the control voltage itself. Filter 7 forms a representation of the time integral of the direct control voltage. In a suitable embodiment, the circuits are dimensioned in such a way that the control voltage has a useful range from 0.5 V to 10 V and the neutral point lies at 5 V. If switch 10 is now actuated, i.e. turned "OFF", for example during a time interval when the useful signal is zero or has low level, the voltage across the input of filter circuit 6 jumps from 0.5 V to a voltage U=5 V. This jump is immediately forwarded to the amplifier 1 via the differentiating branch 8.

Controllable amplifiers always encounter more or less the problem of crosstalk from the control voltage in the useful signal path. A rapid change in control voltage here leads to a "plop" noise. If a useful signal is present and the useful signal itself produces a rise in the control voltage because the useful signal itself is rising, the noise created upon actuation of switch 10 in the direction toward "OFF" would interfere. Such interference is avoided by a circuit of the type shown in FIG. 3.

Figure 3:
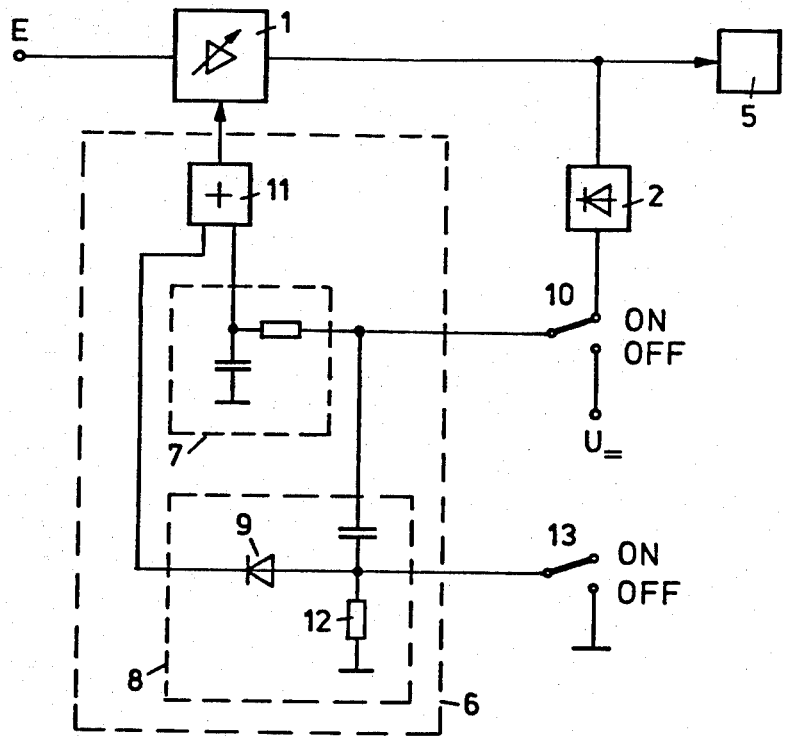
FIG. 3 is a block circuit diagram illustrating a modification of the circuit shown in FIG. 2.

In FIG. 3, a switch 13 is arranged in parallel with the resistor 12 of filter 8 so as to block, or disable, the differentiating channel of filter 8. This switch 13 can be actuated simultaneously with switch 10. In the illustrated embodiment, the control voltage across amplifier 1 then increases only relatively slowly from 0.5 to 5 V due to the integrating effect of circuit 7.

Figure 4:
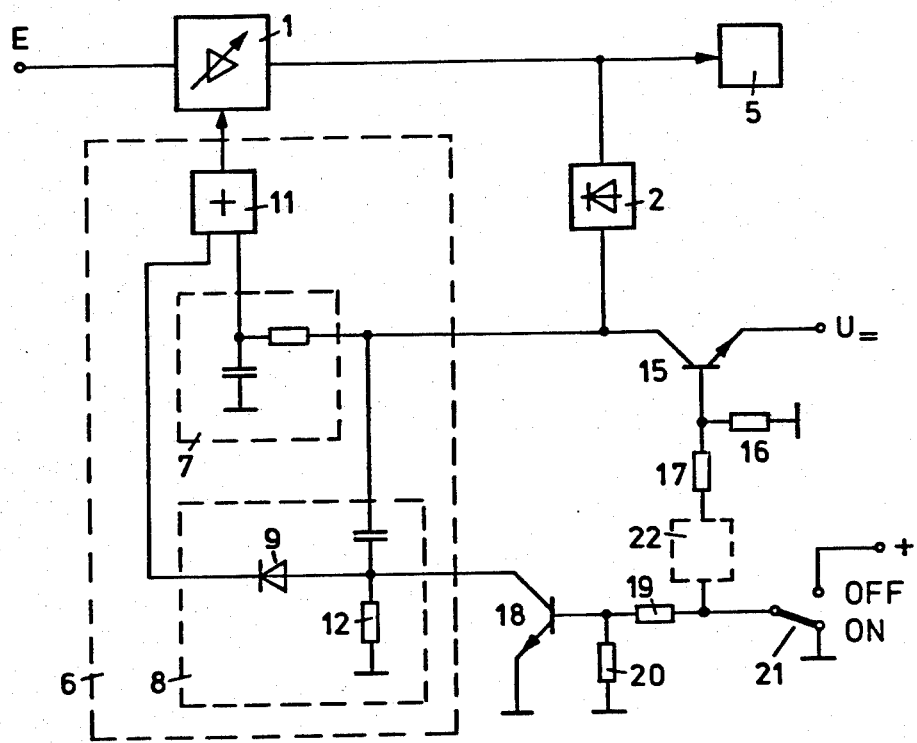
FIG. 4 is a block circuit diagram illustrating a modification of the circuit shown in FIG. 3.

FIG. 4 shows an advantageous modification of FIG. 3 which is particularly suitable for use in a monolithically integrated circuit. Switches 10 and 13 are here replaced by transistors 15 and 18, respectively, which act as switches. If the base voltage dividers 17, 16 or 19, 20, respectively, are connected to ground via a switch 21, when the latter is "ON", the transistors are blocked, i.e. their collector-emitter paths present a high resistance and are thus ineffective. In the other position of switch 21 ("OFF"), the voltage dividers are connected to a point supplying a positive operating voltage. This causes the resistance of the collector-emitter paths of transistors 15 and 18 to be reduced. The output of the control circuit 2 is thus connected via a low resistance path provided by transistor 15 to a source of a fixed voltage U. The low resistance transistor 18 effectively short-circuits the input of circuit 8.

In operation, switch 13 or 18 may be actuated, i.e. turned "OFF", a short time (1 ms) before switch 10 or 15. This assures that even slight interferences, which could otherwise still pass through the differentiating branch before switch 13 closes, are blocked. The shift in time is realized in a circuit according to FIG. 3 in that the mechanical switches 10 and 13 are coupled in such a manner that during the actuation process switch 13 closes earlier. In the circuit according to FIG. 4, a delay member 22 may be included in the control line to transistor 15. The operation of the switches 10,13 and 21 can be manually by the user when compander action is desired or not desired. The switches can also be operated automatically e.g. by a pilot signal added to the useful signal indicating prior compression of the signal.

It will be understood that the above description of the present invention is susceptible to various modifications, changes and adaptations, and the same are intended to be comprehended within the meaning and range of equivalents of the appended claims.

What is claimed is:

1. An electronic amplifier comprising: an electronically controllable amplifier element having a control input for receiving a voltage the value of which determines the gain of said element, with one such value being a predetermined basic gain value of said amplifier element; a control voltage generating circuit for generating a control voltage whose value determines the voltage at the control input of said amplifier element, said element and circuit being constructed for causing the gain of said amplifier element to be unity for one voltage value at its control input and to be different than unity for other voltage values; a nonlinear filter unit connected between said control voltage generating circuit and said amplifier element control input for supplying to said control input a voltage determined by said control voltage, said filter unit including an integrating branch and a differentiating branch having a rectifier device for causing said differentiating branch to be effective only during periods when the control voltage is varying in a selected direction; means for switching said amplifier element and said control voltage generating circuit to a mode of operation in which said amplifier element operates with a constant gain value; and an additional switch connected to said differentiating branch for selectively disabling that branch when said switching means establishes the mode of operation in which said amplifier element operates with a constant gain value.

2. An amplifier as defined in claim 1 wherein said element is constructed such that its gain characteristic has a neutral point corresponding to a gain of unity.

3. Amplifier as defined in claim 2 wherein said means for switching produce a fixed control voltage value which causes said amplifier element to operate with a constant gain corresponding to the neutral point of the gain characteristic of said element.

4. Amplifier as defined in claim 1 wherein said means for switching produce a fixed control voltage value which causes said amplifier element to operate with a constant gain which differs from the neutral point of the gain characteristic of said element.

5. Amplifier as defined in claim 1 wherein said means for switching to the constant gain value are connected between the output of said generating circuit and the control input of said amplifier element.

6. Amplifier as defined in claim 1 wherein said means for switching to the constant gain value are connected between the output of said generating circuit and the input of said nonlinear filter unit.

7. Amplifier as defined in claim 1 wherein said additional switch is operative to selectively disable said differentiating branch shortly before said switching means establishes the mode of operation in which said amplifier element operates with a constant gain value.

* * * * *